US006664612B2

(12) United States Patent
Willer et al.

(10) Patent No.: US 6,664,612 B2
(45) Date of Patent: Dec. 16, 2003

(54) SEMICONDUCTOR COMPONENT HAVING DOUBLE PASSIVATING LAYERS FORMED OF TWO PASSIVATING LAYERS OF DIFFERENT DIELECTRIC MATERIALS

(75) Inventors: Josef Willer, Riemerling (DE); Paul-Werner Von Basse, Wolfratshausen (DE); Thomas Scheiter, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/757,328

(22) Filed: Jan. 9, 2001

(65) Prior Publication Data

US 2001/0019168 A1 Sep. 6, 2001

Related U.S. Application Data

(63) Continuation of application No. PCT/DE99/01982, filed on Jul. 1, 1999.

(30) Foreign Application Priority Data

Jul. 9, 1998 (DE) .......................... 198 30 832

(51) Int. Cl.[7] .............................. H01L 23/58
(52) U.S. Cl. ................ 257/642; 257/637; 257/546; 257/262; 257/645
(58) Field of Search ................ 257/262, 749, 257/18, 232, 298; 207/222, 223, 225, 226, 234, 637, 639, 645, 642

(56) References Cited

U.S. PATENT DOCUMENTS

| 5,373,181 A | * | 12/1994 | Scheiter | 257/415 |
| 5,844,287 A | * | 12/1998 | Hassan | 257/419 |
| 5,851,603 A | | 12/1998 | Tsai et al. | |
| 6,028,773 A | * | 2/2000 | Hundt | 361/760 |
| 6,091,082 A | * | 7/2000 | Thomas | 257/77 |
| 6,091,132 A | * | 7/2000 | Bryant | 257/632 |
| 6,097,195 A | * | 8/2000 | Ackland | 324/719 |
| 6,180,989 B1 | * | 1/2001 | Bryant | 257/414 |
| 6,240,199 B1 | * | 5/2001 | Manchanda | 382/124 |

FOREIGN PATENT DOCUMENTS

| JP | 1 207 932 | | 8/1989 |
| JP | 405102500 A | * | 4/1993 |

OTHER PUBLICATIONS

Patent Abstracts of Japan No. 08–148485 (Takatoshi), dated Jun. 7, 1996.
Patent Abstracts of Japan No. 01–071172 A (Yasuhide), dated Mar. 16, 1989.
Patent Abstracts of Japan No. 05–102500 A (Hiroyuki et al.), dated Apr. 23, 1994.
Patent Abstracts of Japan No. 04–109623 A (Yoshiharu), dated Apr. 10, 1992.
Patent Abstracts of Japan No. 04–184932 A (Hisaharu), dated Jul. 1, 1992.
Patent Abstracts of Japan No. 05–090255 A (Hiroyasu), dated Apr. 9, 1993.
"Novel Fingerprint Scanning Arrays Using Polysilicon TFT's on Glass and Polymer Substrates" (Young et al.), IEEE Electron Device Letters, vol. 18, No. 1, pp. 19–20.

* cited by examiner

Primary Examiner—Wael Fahmy
Assistant Examiner—Nathan W. Ha
(74) Attorney, Agent, or Firm—Laurence A. Greenberg; Werner H. Stemer; Gregory L. Mayback

(57) ABSTRACT

A semiconductor component with passivation includes at least two double passivating layers, of which an uppermost is applied to a planar surface of a layer located therebelow. The double passivating layers include two layers of different dielectric materials, for example silicon oxide and silicon nitride. The respective thicknesses of the individual passivating layers can be adapted to dimensions of the structuring of the layer to which the passivation is applied. This produces a reliable passivation which is particularly suitable for capacitively measuring fingerprint sensors.

4 Claims, 1 Drawing Sheet

SEMICONDUCTOR COMPONENT HAVING DOUBLE PASSIVATING LAYERS FORMED OF TWO PASSIVATING LAYERS OF DIFFERENT DIELECTRIC MATERIALS

CROSS-REFERENCE TO RELATED APPLICATION

This application is a continuation of copending International Application No. PCT/DE99/01982, filed Jul. 1, 1999, which designated the United States.

BACKGROUND OF THE INVENTION

Field of the Invention

The present invention relates to a semiconductor component which is provided on a top side with a resistive planar passivation, such as is suitable, in particular, as a top layer of constant thickness with a planar bearing surface for capacitively measuring fingerprint sensors.

When a surface of a semiconductor component is exposed to the surrounding atmosphere and, as in the case of a fingerprint sensor, is exposed to mechanical wear, it is necessary to passivate that surface so as to maintain functionality of the component. Such a passivation is particularly critical in the case of capacitively measuring micromechanical components, in which it is necessary to maintain a constant distance between an outer top side exposed to wear and conductor surfaces integrated in the component. Particularly with fingerprint sensors in which that outer top side forms a bearing surface for a fingertip, it is essential for that bearing surface to be completely planar, and in addition, even in the case of lengthy stressing, for it to ensure a fixed distance of the applied fingertip from the conductor surfaces provided for the measurement. Silicon oxide layers and silicon nitride layers are the customary passivations in the fabrication of microelectronic components, for example in the material system of silicon. The top side of the semiconductor component is usually provided with connector contacts and conductor tracks for electric wiring. It is possible for various metallization levels to be present which respectively include structured metal layers and are separated from one another by dielectric material (intermediate oxides). It is customary to apply an oxide layer to the top side of the uppermost metallization level. The oxide layer is deposited, for example, from a plasma through the use of CVD (chemical vapor deposition) from an $SiH_4/N_2O$ atmosphere at approximately 400° C., and is typically approximately 300 nm thick. A further passivating layer of silicon nitride ($Si_3N_4$) can be deposited thereon from a plasma through the use of CVD in an $SiH_4/NH_3/N_2$ atmosphere, likewise at approximately 400° C. with a typical thickness of 550 nm. Since the metallization level is structured, the passivation deposited over the entire surface cannot be given a planar top side, but is uneven at the edges of the metallization.

It has been proved, in the case of fingerprint sensors, in particular, that indiffusion of sodium can occur because of the contact of the sensors. The reason therefor can firstly be that the passivation has defects which lead to degradation through the occurrence of so-called pinholes. Secondly, even largely conformally deposited layers have growth joints in corners between vertical edges and surfaces parallel to the plane of the layer. The growth joints appear due to increased etching rates and the barrier effect of the passivation can be substantially weakened at the growth joints. The barrier effect cannot be sufficiently improved by applying thicker layers, since the sensitivity of capacitively measuring components decreases too sharply due to the increased thickness of the passivating layer.

SUMMARY OF THE INVENTION

It is accordingly an object of the invention to provide a semiconductor component with passivation, which overcomes the hereinafore-mentioned disadvantages of the heretofore-known devices of this general type and which is passivated in such a way that a top side is planar and a constant distance from an integrated metallization layer is maintained.

With the foregoing and other objects in view there is provided, in accordance with the invention, a semiconductor component, comprising a semiconductor body and a layer structured with interspaces. The layer is carried by the semiconductor body and has a side facing away from the semiconductor body. A passivation covers the side of the structured layer facing away from the semiconductor body and fills the interspaces in the structured layer. The passivation includes at least two double passivating layers applied one above another. The at least two double passivating layers include a double passivating layer disposed furthest from the semiconductor body and a preceding double passivating layer having a planarized top side. Each of the double passivating layers is formed of two passivating layers of different dielectric materials. At least the double passivating layer disposed furthest from the semiconductor body is applied with uniform thickness to the planarized top side of the preceding double passivating layer.

In accordance with another feature of the invention, the double passivating layer contains a passivating layer of oxide and a passivating layer of nitride.

In accordance with a further feature of the invention, the structured layer is a metallization layer applied to at least one layer of a dielectric on a top side of the semiconductor body.

In accordance with a concomitant feature of the invention, the metallization layer forms conductor surfaces of a capacitively measuring fingerprint sensor, and the at least two double passivating layers include a double passivating layer disposed furthest from the metallization layer and having a surface forming a bearing surface for a fingertip.

In the case of the semiconductor component according to the invention, a multilayer passivation is present which includes at least two double passivating layers, and has an uppermost double passivating layer that is applied to a planar surface of the double passivating layer located therebelow. The double passivating layers can be formed in each case by a passivating layer of an oxide, preferably silicon oxide, and a passivating layer of a nitride, preferably silicon nitride. Two such double passivating layers are already sufficient to provide an unexpectedly substantial improvement in the passivating properties of the passivation. However, more than two double passivating layers can also be present. The double passivating layers are composed of two layers of different dielectric materials. It is possible for different double passivating layers to include different pairs of materials. The respective thicknesses of the individual passivating layers can be adapted to the respective dimensions of the component, in particular the dimensions of the structuring of the layer to which the passivation is applied.

Other features which are considered as characteristic for the invention are set forth in the appended claims.

Although the invention is illustrated and described herein as embodied in a semiconductor component with passivation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
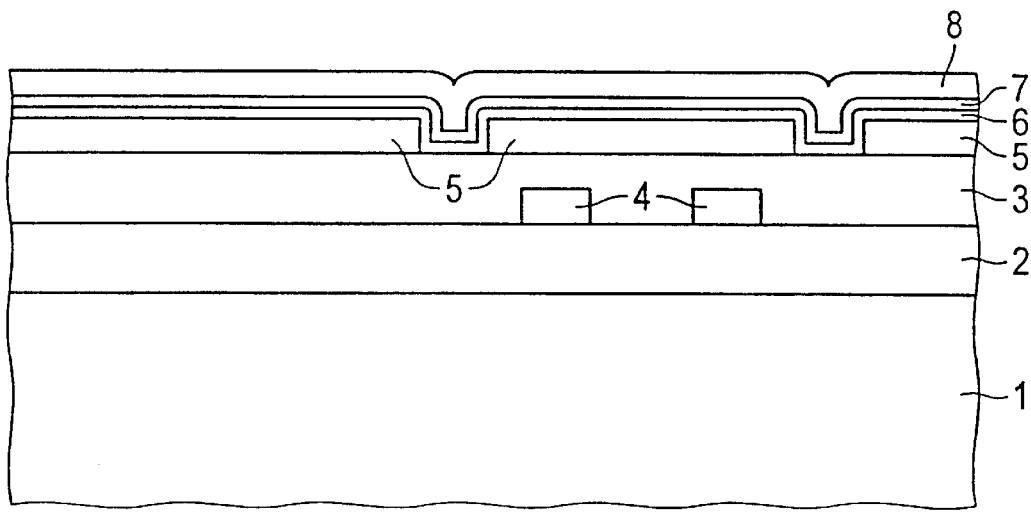
FIGS. 1 and 2 are fragmentary, diagrammatic, cross-sectional views of intermediate products in the fabrication of a typical component of this type.

Referring now to the figures of the drawings in detail and first, particularly, to FIG. 1 thereof, there is seen a cross section of a semiconductor body 1, which can, for example, be a substrate with semiconductor layers grown thereupon. A dielectric layer 2 is disposed on the semiconductor body 1 as an intermediate metal oxide or as a lowermost passivation of semiconductor material, for example of BPSG (borophosphorus silicate glass). A structured lower metallization level 4, which is shown as an example, is disposed on the dielectric layer 2. A further dielectric layer 3, which electrically insulates the metallization level 4 from a further metallization layer 5, is disposed on the dielectric layer 2 and on the metallization level 4. It is possible for the metallizations to be connected to one another at specific sites by vertical contacts. The further metallization level 5 forms an uppermost metallization level in this case. Finally, a passivation is provided, which is to be described in more detail below.

Three layers of this passivation are initially illustrated in FIG. 1. A first double passivating layer includes a first lower layer 6 and a second upper layer 7. The lower passivating layer 6 of this first double passivating layer can, for example, be a conventional oxide which can be deposited in the manner described at the outset. The upper passivating layer 7 of this first double passivating layer is a different dielectric material. If the first passivating layer 6 is an oxide, the second passivating layer 7 is preferably a nitride, which can likewise be deposited as described at the outset. During fabrication, a first passivating layer 8 of a second double passivating layer, for example an oxide again, is deposited somewhat more thickly onto this first double passivating layer. The layer 8 is somewhat ablated, and this can be done, for example, through the use of CMP (chemical mechanical polishing). An etching process can be used alternatively or in addition thereto. A very planar surface of this layer 8 results in this way.

Figure 2:
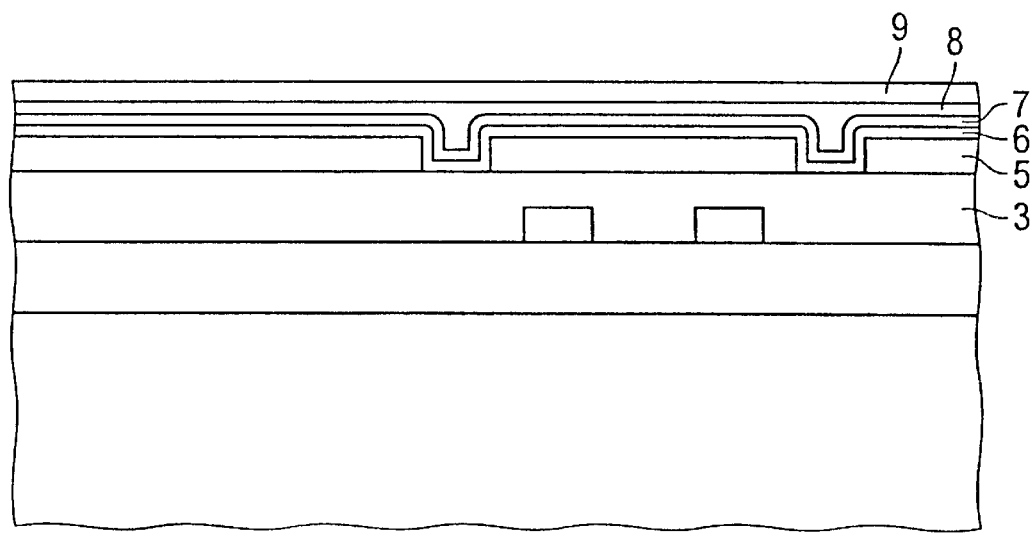

Apart from the layer structure illustrated in FIG. 1, FIG. 2 illustrates a polished-back first passivating layer 8 of the second double passivating layer with a planar top side. A second passivating layer 9 of the second double passivating layer is deposited in a very planar manner over the entire surface of the layer 8. The layer 9 is preferably a nitride again. This produces a layer sequence of oxide-nitride-oxide-nitride in this preferred embodiment of the passivation according to the invention.

A plurality of double passivating layers can also be present instead of only two double passivating layers. The site at which the top side of such a double passivating layer is planarized depends on the respective application and, in particular, on the layer thicknesses and the dimensions of the structure in the upper metallization level 5. If appropriate, a further layer can be applied to the top side as a special covering. This is of interest, in particular, whenever the upper passivating layer is not hard enough to adequately resist mechanical wear.

In the case of this component, at least two double passivating layers are applied one above another, and at least the uppermost double passivating layer, acting as an amorphous diffusion barrier, is deposited on a surface which is as planar as possible, so that the uppermost double passivating layer has no edge-induced diffusion paths. By virtue of this construction, particularly good passivation is achieved with the component according to the invention. The combination of a plurality of layers suppresses the production of diffusion paths which could arise due to pinholes that cannot be entirely avoided.

The passivating layer which is provided for planarizing the top side can also be produced during fabrication in two mutually separate method steps. The back-etching or back-polishing of this layer is then undertaken to the extent to which a very planar surface is achieved, independently of whether or not a thickness of this layer, provided for this passivating layer, remains. If the layer has been polished back too far, in particular as far as the top side of the passivating layer located therebelow, a layer of the material of this polished-back layer is applied anew, in which case this newly applied layer is now provided with a very planar surface. A fabrication method can, for example, include the deposition of the first double passivating layer of typically 300 nm oxide and 550 nm nitride, a deposition of an oxide layer approximately 500 nm thick, a selective CMP step with a stop at the previously deposited nitride layer, and the complete deposition of the second double passivating layer of typically 300 nm oxide and 550 nm nitride. Further method steps for structuring the passivation in lateral regions and for producing electric terminals which are still required, can be added.

We claim:

1. A semiconductor component forming a capacitively measuring fingerprint sensor, comprising:

a semiconductor body;

a layer structured with interspaces, said layer carried by said semiconductor body, having a side facing away from said semiconductor body, and forming conductor surfaces of the capacitively measuring fingerprint sensor;

a passivation covering said side of said structured layer facing away from said semiconductor body and filling said interspaces in said structured layer, said passivation including at least two double passivating layers applied one above another, and said at least two double passivating layers including a double passivating layer having a surface forming a bearing surface for a fingertip disposed furthest from said semiconductor body and a preceding double passivating layer having a planarized top side, said double passivating layer disposed furthest from said semiconductor having upper and lower plane boundary surfaces, said lower plane boundary surface forming a boundary surface for said preceding double passivating layer and said upper plane boundary surface forming a bearing surface for the fingertip;

each of said double passivating layers formed of two passivating layers of different dielectric materials; and at least said double passivating layer disposed furthest from said semiconductor body applied with uniform thickness to said planarized top side of said preceding double passivating layer.

2. The component according to claim 1, wherein at least one of said double passivating layers contains a passivating layer of oxide and a passivating layer of nitride.

3. The component according to claim 1, wherein said structured layer is a metallization layer applied to at least one layer of a dielectric on a top side of said semiconductor body.

4. The component according to claim 3, wherein said double passivating layer having a surface forming a bearing surface is disposed furthest from said metallization layer.

* * * * *